(12) United States Patent
Englemann et al.

(10) Patent No.: US 6,723,937 B2
(45) Date of Patent: Apr. 20, 2004

(54) TOUCH SWITCH WITH A KEYPAD

(75) Inventors: Harry Englemann, Ingelhim (DE); Kurt Schaupert, Hofheim (DE)

(73) Assignee: Schott Glas, Mainz (DE)

( * ) Notice: Subject to any disclaimer, the term of this patent is extended or adjusted under 35 U.S.C. 154(b) by 0 days.

(21) Appl. No.: 10/120,301

(22) Filed: Apr. 10, 2002

(65) Prior Publication Data

US 2002/0144886 A1 Oct. 10, 2002

(30) Foreign Application Priority Data

Apr. 10, 2001 (DE) .......................... 101 17 956

(51) Int. Cl.[7] ................. H03K 17/975; H03K 17/96; G06F 3/02; H01H 9/16
(52) U.S. Cl. ................... 200/600; 307/112; 341/33
(58) Field of Search ................. 200/600, 5 A; 307/112–125; 310/339; 341/33; 345/156–182

(56) References Cited

U.S. PATENT DOCUMENTS

| 4,876,461 A | * | 10/1989 | Gratke ................. 307/116 |
| 4,920,343 A | * | 4/1990 | Schwartz ............... 341/33 |
| 4,977,298 A | * | 12/1990 | Fujiyama .............. 200/5 A |
| 5,012,124 A | * | 4/1991 | Hollaway .............. 307/116 |
| 5,270,710 A | * | 12/1993 | Gaultier et al. ........ 341/33 |
| 5,572,205 A | * | 11/1996 | Caldwell et al. ....... 341/33 |
| 5,594,222 A |   | 1/1997  | Caldwell |
| 5,674,018 A | * | 10/1997 | Kaufman et al. ........ 400/473 |
| 5,982,304 A | * | 11/1999 | Selker et al. .......... 341/27 |

FOREIGN PATENT DOCUMENTS

| DE | 42 07 772 C2 | 9/1993 |
| DE | 44 00 790 A1 | 5/1995 |
| DE | 196 26 249 A1 | 1/1998 |
| DE | 197 12 137 A1 | 9/1998 |
| DE | 200 08 310 A1 | 9/2000 |
| EP | 0 054 306 A1 | 6/1982 |

* cited by examiner

Primary Examiner—James R. Scott
(74) Attorney, Agent, or Firm—Fulbright & Jaworski, LLP

(57) ABSTRACT

In a touch switch with a keypad 2, a tactual feedback of its operation, perceptible to the user, is said to be achieved. For this purpose a transducer 7 is provided, which upon a touching of the keypad 2 impressed a movement on the latter.

17 Claims, 3 Drawing Sheets

TOUCH SWITCH WITH A KEYPAD

BACKGROUND OF THE INVENTION

The present invention relates to a touch switch with a keypad.

Touch switches of this kind are described in EP 0 054 306 A1, DE 42 07 772 C2 and U.S. Pat. No. 5,594,222. Such touch switches perform the switching action not because the operator moves a switch part but because the hand or finger of the operator changes the capacity, the lines of force or the optical reflection of the touch switch.

Also known are translucent touch switches for the input of data to video screens, which are based on optical, capacitive or resistive principles.

In DE 197 12 137 A1 a touch switch is described in which the piezo effect is utilized.

Since in touch switches of this kind no keys are mechanically moved, the operator lacks tactual feedback of the switching operation. In order nevertheless to give the operator feedback, acoustical or optical signals are alternatively generated as feedback. Many operators, however prefer direct tactual feedback to an acoustical or optical signal. It is also known that a person reacts more slowly to optical and acoustical stimuli than to tactile stimuli.

SUMMARY OF THE INVENTION

The invention is addressed to the problem of proposing a touch switch of the kind referred to above, which will give a tactual feedback when operated.

The above problem is solved by the invention in that a transducer is provided which, when the keypad is touched, impresses a movement thereon.

This brings it about that, when the operator touches the keypad the transducer impresses a movement thereon virtually simultaneously. The operator thus receives a tactical feedback of the operating action. The movement may be a brief pulse or a vibration.

It is an advantage of tactual feedback that it is felt only by the operator, and in contrast to acoustical or optical feedback it cannot be perceived by bystanders. Thus the privacy of operation is improved, which is considerable in the case of bank teller machines.

Such tactual feedback can be used in any apparatus which is operated by touch switches, such as glass ceramic cooktops in which the touch switches are integrated into the glass ceramic cooktop, keypads for stoves, cook ovens and microwave ovens, touch screens in computers, such as PC's, laptops, and personal digital assistants. They can also be used in input terminals on bank teller machines, slot machines, remote controls, mobile telephones, controls for computer games, photographic apparatus and office machines.

In the embodiment of the invention, in the case of a keypad with a plurality of touch zones, each touch zone has its own transducer. Tests have shown, however, that it is sufficient in the case of a keypad with a plurality of touch zones to provide only a single transducer. This single transducer suffices to make the feedback perceptible in all touch zones. The distance from the transducer to the individual touch zones increases as the modulus of elasticity of the material of the keypad increases. The local relationship between the transducer and a particular touch zone is less important functionally than the time lapse between the touching of the switch surface or its particular touch zone and the tactile signal. The tactile signal is to occur in the period in which the operator usually holds his finger on the touch zone. Thus there is a possibility for arranging the transducer outside of the range in which touch zones and display devices, if any, are provided.

Preferably the keypad is a continuous glass, glass ceramic or plastic surface. The keypad can be an area of larger surface which serves other purposes, such as a display function and/or cooking function.

Preferably the transducer is a piezoceramic element or an electromagnetic transducer.

The transducer can be connected to the keypad such that it transfers its movement to the keypad. However, it can also be placed close by the keypad such that it knocks against the keypad. This can be provided especially in a magnetically operated transducer. Thus a certain interval exists between the moving part of the electromagnetic transducer and the keypad.

In an embodiment of the invention the transducer is the same piezoceramic element that is also the sensor detecting the touching of the keypad or touch zone, in which case the piezoceramic element acts first as a sensor upon contact and then as a transducer. Thus the same piezoceramic element simultaneously triggers the switching function of the touch switch and the feedback.

In another embodiment the frequency and/or the intensity (amplitude) of the movement of the transducer when different touch zones of the keypad are touched is made tactually different. The user can thus know without looking, in case of the successive touching of touch zones, whether the desired input made by the previous touch zone contact has been made correctly. The transducer thus gives the operator not only feedback of the touching of the touch zones but also confirmation of the reading of the entry.

In a further embodiment of the invention, the duration and/or frequency and/or intensity (amplitude) of the movement of the transducer is dependent upon the duration of the contact with the keypad or touch zone. This is advantageous whenever different values are set according to the duration of contact. For example, in many touch switches the input value is increased or reduced by longer contact. By this embodiment the tactual feedback is matched to the entry. For example, it can be used in a photographic apparatus to provide tactile perception of the operation "set autofocus" and "shoot."

Various other objects, advantages, and features of the present invention will become readily apparent from the ensuing detailed description, and the novel features will be particularly pointed out in the appended claims.

BRIEF DESCRIPTION OF THE DRAWINGS

Additional advantageous embodiments will be found in the subordinate claims and in the following description, wherein:

DETAILED DESCRIPTION OF THE EMBODIMENTS

Figure 1:
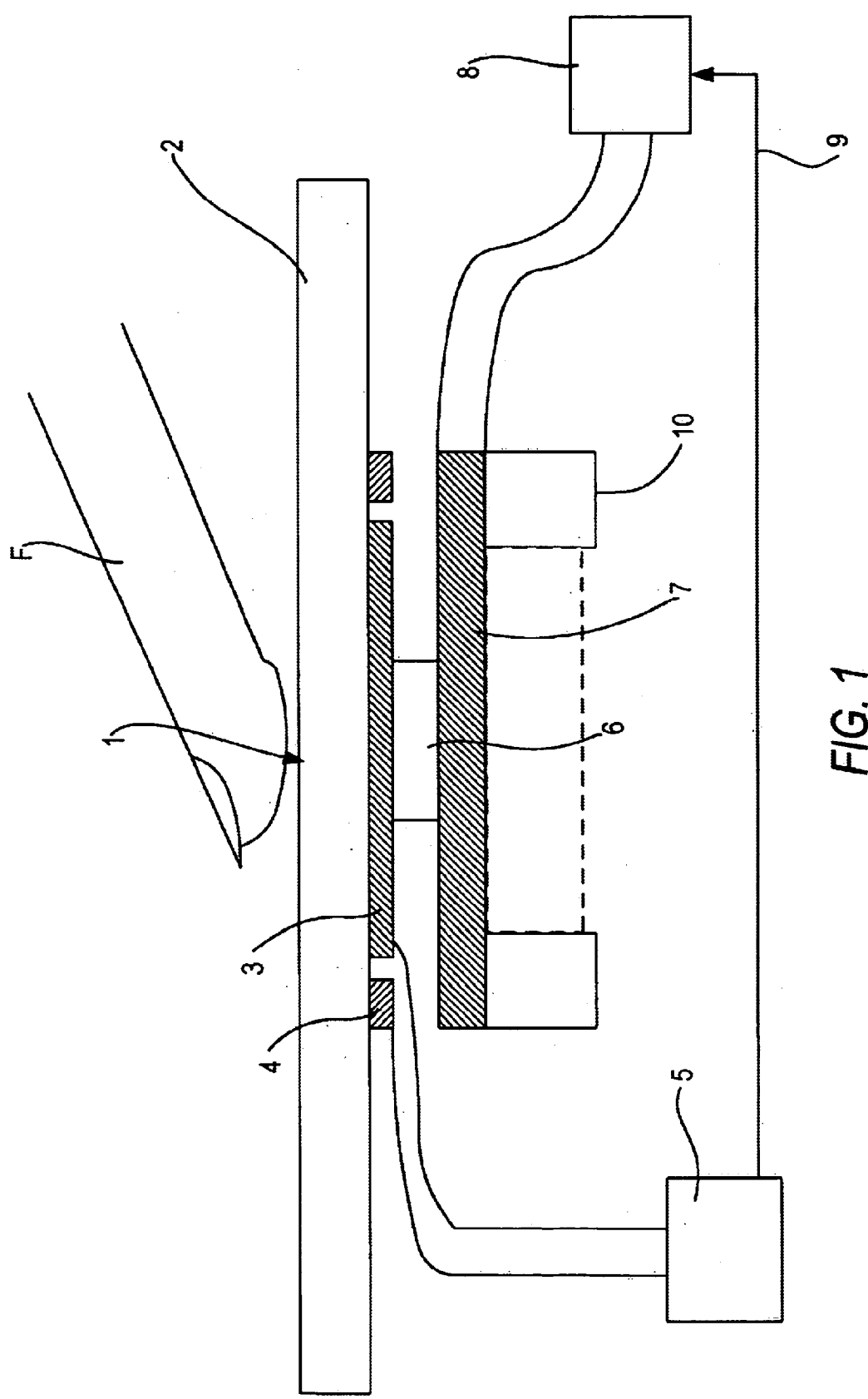
FIG. 1 shows a touch switch schematically.
Figure 2:
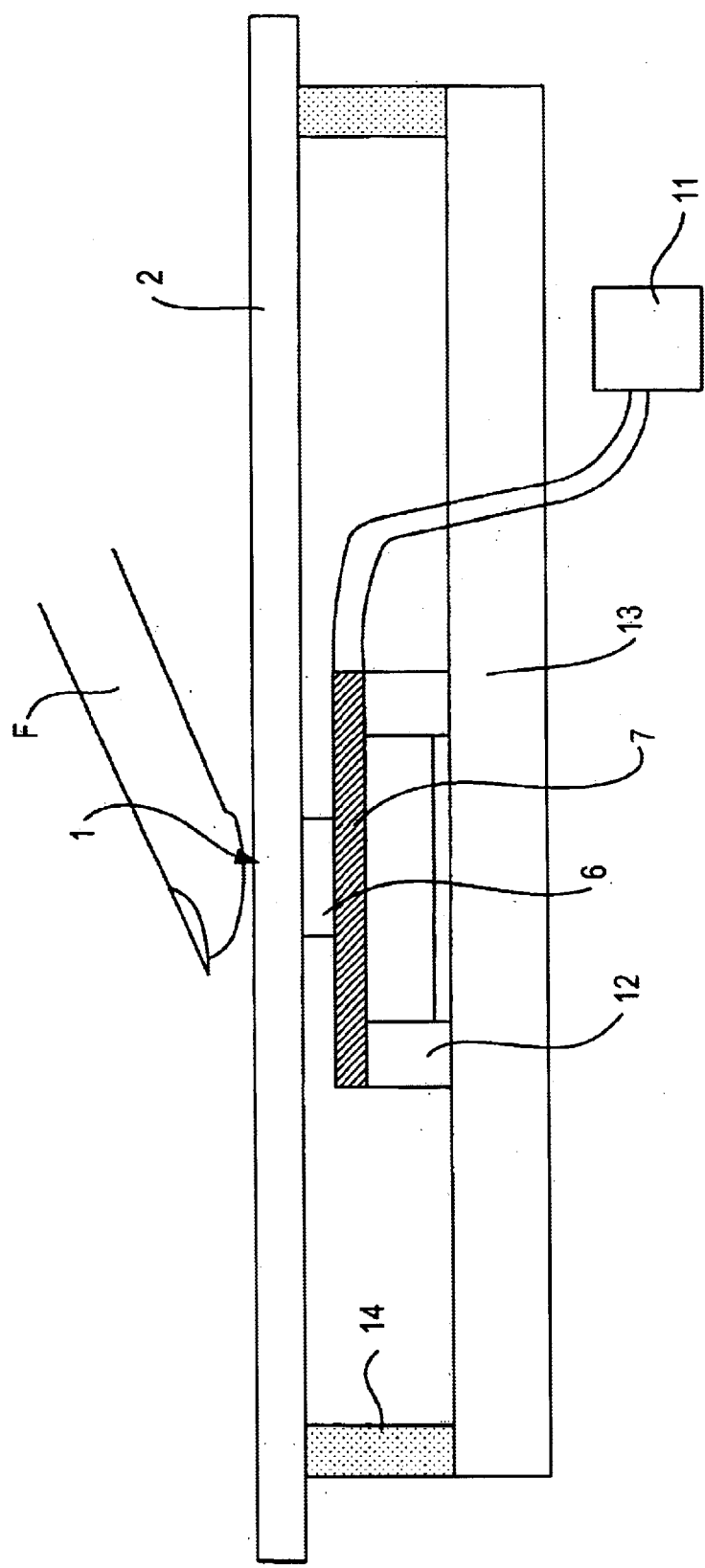
FIG. 2 shows an additional touch switch schematically.

In FIGS. 1 and 2, a touch switch with only one touch zone 1 on a keypad 2 in order to simplify the drawing. The keypad 2 has in practice a plurality of touch zones arranged in columns and lines or otherwise laid out for numerical or alphanumerical data entry. Accordingly, then, a plurality of touch switches can be provided on the same keypad.

The keypad 2 is, for example, an area of a glass ceramic plate of a cook stove or a touch screen of a computer or a keypad of some other apparatus whose operations can be controlled by key entry.

In the embodiment in FIG. 1 the touch switch has, as a capacitive sensor in the touch zone 1, an inner electrode 3 and an outer electrode 4 surrounding it. Such a sensor is described, for example, in U.S. Pat. No. 5,594,222. When the key zone 1 is touched by a finger F of the user, an evaluation circuit 5 turns on or off the desired apparatus function, such as an associated cooktop burner.

On the inner electrode 3 there is a coupling body 6 which connects the inner electrode 3, and thus the touch zone 1, to a piezoceramic element 7. The coupling body 6 lies only in the central area of the piezoceramic element 7. The piezoceramic element 7 is a transducer in the form of a flexural oscillator which when excited brings the keypad 2 through the coupling body 6 into a movement perceptible to the finger F.

The piezoceramic element 7 is set in motion through an exciter circuit 8 as soon as it receives a signal from the evaluation circuit 5 through a conductor 9. The evaluation circuit 5 gives this signal as soon as it receives a touch signal from the sensor (electrodes 3, 4), especially for as long as the finger F continues to rest on the touch zone 1. Thus the finger F receives a tactual feedback through contact with the touch zone.

When excited through the exciter circuit 8 the piezoceramic element 7 gives single strokes or groups of strokes in the form of dynamic vibrations to the key zone 1.

To amplify the effect of the tactual feedback, a weight 10 is attached to the side of the piezoceramic element 7 that faces away from the keypad 2. This weight system can be tuned to its resonant frequency to intensify the tactual feedback effect.

If the keypad 2 has a plurality of touch zones 1 each associated with its own touch sensor, i.e., external electrodes 4 and internal electrodes 3, and each has its own evaluation circuit 5, there does not have to be a transducer for each touch zone 1, i.e., a piezoceramic element 7. In order to give the tactual feedback it is sufficient to provide a single piezoceramic element 7 remote from the touch zones 1 and excite it to movement by the several evaluation circuits 5 through the excitation circuit 8.

Instead of the piezoceramic element 7, an electromechanical, i.e., magnetically driven, transducer can be provided. This has a coil in which current flows when the exciter circuit 8 is activated and has a moving part in the manner of a familiar buzzer or loudspeaker. The moving part is connected rigidly to the keypad 2 or to the particular touch zone 1 and knocks against the keypad 2 or touch zone 1, for which purpose the moving part is then at a short distance from the keypad 2 or the inner electrode 3 of touch zone 1.

In the embodiment in FIG. 2 a piezoceramic element 7 is provided in a known manner for contacting the touch zone 1 or keypad 2. The piezoceramic element 7 is connected to an electrical circuit 11 which takes over the operation of the evaluation circuit 5 and exciter circuit 8 of the embodiment in FIG. 1. The sensor function and the transducer function is thus performed by the same component, namely the piezoceramic element 7, so that separate components for the sensor function and the transducer function are not necessary.

If in the embodiment in FIG. 2 the touch zone 1 is touched by the operator, then the electric circuit 11 performs the corresponding switching function and while the touch zone 1 is still contacted it excites the piezoceramic element 7 to touch-perceptible movement. This is represented in the time diagram in FIG. 3 in the lines a, b and c.

Figure 3A:
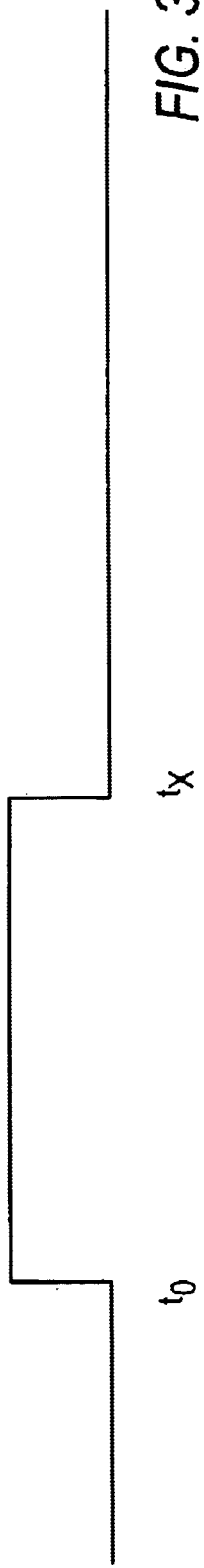
FIG. 3 is a time diagram for the touch switch of FIG. 2.
Figure 3B:
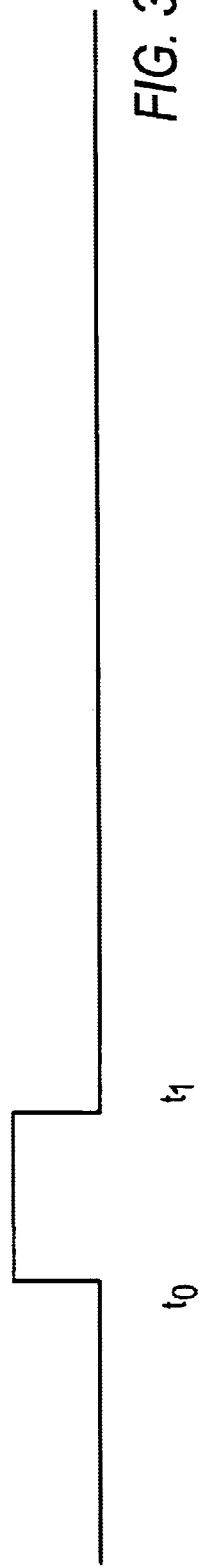
Figure 3C:
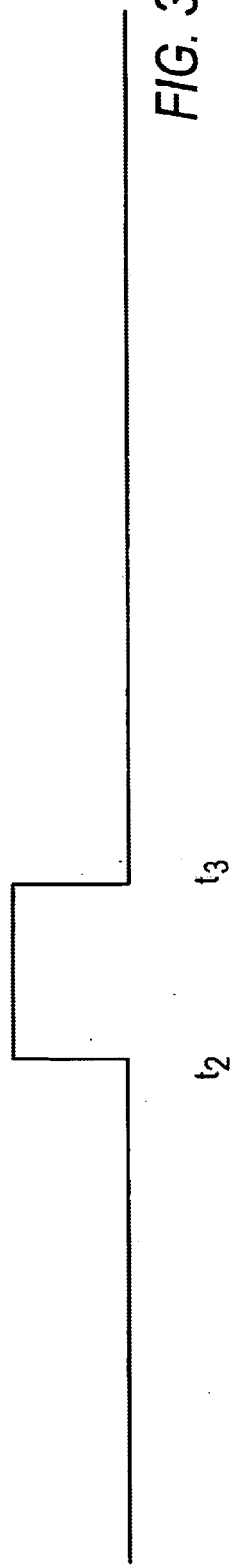

At the moment t0, the operator touches the touch zone 1 and stops touching it at the moment tx (cf. line a in FIG. 3).

At the moment t0 or with a negligible delay, the circuit 11 turns the sensor function of the piezoceramic element 7 on unless it has already been turned on. The circuit 11 turns on the sensor function off after a time period sufficient for the performance of the desired switching function. This is the case at the moment t1 (cf. line b in FIG. 3).

After the circuit 11 has turned off the sensor functions at the moment t2, it switches the transducer function of the piezoceramic element 7, with a certain delay, to the active state, whereby the operator receives tactual feedback on the switch operation (cf. line c in FIG. 3). The transducer function is shut off by the circuit 11 at the moment t3, which can be before or after the moment tx. The length from t2 to t3 is limited, so that the piezoceramic element 7 is again available as sensor for the next touching of touch zone 1.

In the embodiment of the present invention provision can be made such that, when the various touch zones are touched, signals which are tactually distinguishable, for example signals differing in frequency and/or intensity, are produced. In the numerical section of the usual PC keyboard, the key of numeral 5 bears a tactually perceptible mark, so that it can be recognized even without being seen. Accordingly, it can be provided in the apparatus in question that, when a key, for example the "5" of the number keypad, is operated a different tactual signal is formed than when any of the other keys of the number keypad is depressed.

It can also be provided such that function keys, alphabet keys and/or number keys of a keyboard will give different tactual signals when operated.

In the embodiment of the present invention it can also be arranged that the duration and/or frequency and/or intensity of the movement of the transducer 7 depends on the duration of the touching of the keypad 2 or touch zone 1. In the art, functions are known in which a numeral display or a bar graph ("thermometer display") changes during the depression of a key according to the duration of the touch. A corresponding feedback can be achieved in the system described if the intensity or the frequency of the tactile signal changes according to the duration of the key depression. Thus the user receives a tactual feedback indicating the actual value established in each case.

In the embodiment in FIG. 2 the piezoceramic element 7 is mounted by a ring-shaped insert 12 or individual inserts on a supporting plate 13. The supporting plate 13 can include several touch zones. Thus, several inserts 12 for several touch zones 1 can be supported on the same plate 13. The supporting plate 13 is joined to the keypad 2 outside of the touch zones through one connecting element 14, especially an annular one, or several single connecting elements. The supporting plate serves for the transfer of greater force than in the system according to FIG. 1, or for an intensified transfer of vibration from the transducer 7 to the touch zone 1. In the embodiment according to FIG. 1, the touch zone 1 is moved by the transfer of force by the transducer, especially to flexural vibrator 7, through the coupling body 6, the flexural vibrator 7 resting externally on the inert mass of the annular weight 10. This is sufficient in most cases and permits a very close positioning of adjacent touch zones compared with FIG. 2.

In the embodiment in FIG. 2, the flexural vibrator 7 is supported by insert 12 on the inflexible support plate 13, which is what is of interest here, and which in turn is fixedly joined—outside of the touch zones 1—by the connecting element 14 to the keypad 2. The connecting element 14 is not deformable in this particular regard. In this system the deflection or flexure that is performed when the touch zones 1 are touched is greater than in the embodiment in FIG. 1, which simplifies its employment in the production of the tactual signal.

While the present invention has been particularly described with respect to the illustrated embodiments, it will be appreciated that various alterations, modifications and adaptations may be made based on the present disclosure, and are intended to be within the scope of the present invention. It is intended that the appended claims be interpreted as including the embodiments discussed above, the various alternatives that have been described, and all equivalents therein.

What is claimed is:

1. A touch switch comprising:
   a keypad comprising a plurality of touch zones, each touch zone having a capacitive sensor for detecting when said each touch zone is touched by an operator; and
   a transducer imposing a movement on the keypad when the keypad is touched by an operator to provide a tactual feedback.

2. The touch switch of claim 1, wherein a transducer is associated with each touch zone.

3. The touch switch of claim 2, wherein the transducer is operable to vary frequencies or intensity of the movement imposed on the keyboard for each touch zone of the keyboard, thereby providing tactually distinguishable movement for each touch zone.

4. The touch switch of claim 1, wherein the transducer is common to each touch zones.

5. The touch switch of claim 4, wherein the transducer is operable to vary frequencies or intensity of the movement imposed on the keyboard for each touch zone of the keyboard, thereby providing tactually distinguishable movement for each touch zone.

6. The touch switch of claim 1, wherein the keypad is either a glass surface, a glass ceramic surface or a plastic surface.

7. The touch switch of claim 1, wherein the transducer is a piezoceramic element.

8. The touch switch of claim 7, wherein the piezoceramic element is operable to detect the touching of the keypad or touch zone, such that the piezoceramic element operates first as a sensor and thereafter as a transducer when the keypad is touched by the operator.

9. The touch switch of claim 7, further comprising a coupling body mechanically connecting the piezoceramic element to the keypad.

10. The touch switch of claim 9, wherein the coupling body is operable to mechanically connect the piezoceramic element to the touch zones.

11. The touch switch of claim 7, wherein the piezoceramic element is a flexural vibrator on which a weight is disposed.

12. The touch switch of claim 7, further comprising a supporting plate having at least one intermediate piece for mounting the piezoceramic element to the supporting plate and at least one connecting element for connecting the supporting plate to the keyboard.

13. The touch switch of claim 1, wherein the transducer is an electromagnetic transducer.

14. The touch switch of claim 1, wherein the transducer is connected to the keypad such that the movement of the transducer is transferred to the keypad.

15. The touch switch of claim 1, wherein the transducer is arranged close to the keypad such that the transducer knocks against the keypad when the keypad is touched by the operator.

16. The touch switch of claim 1, wherein the transducer is operable to vary duration, frequency or intensity of the movement imposed on the keyboard based on the duration that the keyboard is touched by the operator.

17. The touch switch of claim 16, wherein the transducer is operable to vary duration, frequency, and intensity of the movement imposed on the keyboard based on the duration that the touch zones are touched by the operator.

* * * * *

UNITED STATES PATENT AND TRADEMARK OFFICE
CERTIFICATE OF CORRECTION

PATENT NO. : 6,723,937 B2  Page 1 of 1
DATED : April 20, 2004
INVENTOR(S) : Harry Engelmann et al.

It is certified that error appears in the above-identified patent and that said Letters Patent is hereby corrected as shown below:

<u>Title page,</u>
Item [75], Inventors, change "Englemann" to -- Engelmann -- and change "Ingelhim" to -- Ingelheim --.

Signed and Sealed this

Twenty-ninth Day of March, 2005

JON W. DUDAS
*Director of the United States Patent and Trademark Office*